(12) United States Patent
Iyer et al.

(10) Patent No.: US 8,977,999 B2
(45) Date of Patent: Mar. 10, 2015

(54) NUMERICAL DELAY MODEL FOR A TECHNOLOGY LIBRARY CELL TYPE

(71) Applicant: Synopsys, Inc., Mountain View, CA (US)

(72) Inventors: Mahesh A. Iyer, Fremont, CA (US); Amir H. Mottaez, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/246,857

(22) Filed: Apr. 7, 2014

(65) Prior Publication Data

US 2014/0223400 A1 Aug. 7, 2014

Related U.S. Application Data

(62) Division of application No. 13/450,178, filed on Apr. 18, 2012, now Pat. No. 8,762,905.

(51) Int. Cl.
*G06F 17/50* (2006.01)

(52) U.S. Cl.
CPC ........ *G06F 17/5031* (2013.01); *G06F 17/5036* (2013.01)
USPC ........... 716/108; 716/100; 716/101; 716/104; 716/110; 716/113; 716/132; 716/134

(58) Field of Classification Search
USPC ......... 716/100–101, 104, 108, 110–111, 113, 716/132, 134
See application file for complete search history.

(56) References Cited

U.S. PATENT DOCUMENTS

| | | |
|---|---|---|
| 4,924,430 A | 5/1990 | Zasio et al. |
| 7,222,311 B2 | 5/2007 | Kaufman et al. |
| 7,222,318 B2 | 5/2007 | Srinivasan |
| 7,483,819 B2 | 1/2009 | Gurumurthy et al. |
| 7,921,392 B2 | 4/2011 | Furnish |
| 7,930,674 B2 | 4/2011 | Parker et al. |
| 7,958,484 B2 | 6/2011 | Kalafala et al. |
| 8,196,077 B2 | 6/2012 | Yoda |
| 8,332,793 B2 | 12/2012 | Bose |
| 8,527,257 B2 | 9/2013 | Reddy et al. |
| 8,607,176 B2 | 12/2013 | Soreff et al. |
| 2005/0229142 A1 | 10/2005 | Boppana |
| 2010/0313176 A1 | 12/2010 | Takahashi et al. |
| 2011/0204918 A1 | 8/2011 | Nojiri |

*Primary Examiner* — Stacy Whitmore
(74) *Attorney, Agent, or Firm* — Park, Vaughan, Fleming & Dowler LLP; Laxman Sahasrabuddhe

(57) ABSTRACT

Methods and systems for determining a numerical delay model based on one or more discretized delay models are described. A discretized delay model is a delay model in which the delay behavior is represented using a set of discrete data points of delay behavior. A numerical delay model is a delay model that can be used by a numerical solver to optimize a cost function. In general, computing delay using a numerical delay model is significantly faster than computing delay using discretized delay models. This performance improvement is important when optimizing a design for various metrics like timing, area and leakage power, because repeated delay computations are required in circuit optimization approaches.

15 Claims, 3 Drawing Sheets

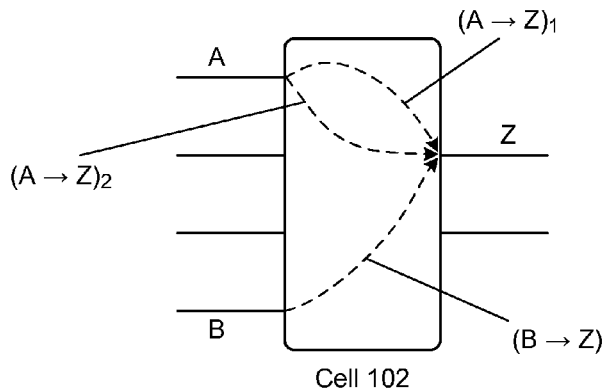
FIG. 1
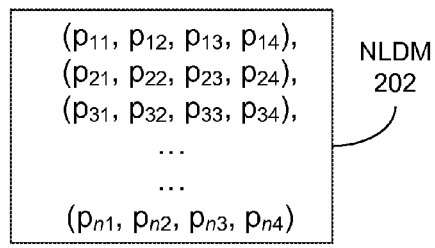
FIG. 2A
FIG. 2B

NUMERICAL DELAY MODEL FOR A TECHNOLOGY LIBRARY CELL TYPE

RELATED APPLICATION

This application is a divisional application of, and claims priority to, U.S. application Ser. No. 13/450,178, having the same inventors and title, filed on 18 Apr. 2012.

BACKGROUND

1. Technical Field

This disclosure relates to electronic design automation (EDA). More specifically, this disclosure relates to methods and apparatuses for deriving a numerical delay model for a technology library cell (or "library cell" for short) and/or a technology library cell type (or "library cell type" for short).

2. Related Art

The goal of circuit synthesis is to convert a high-level description of a circuit design into an implementation that meets a set of timing constraints, and at the same time optimizes one or more metrics, such as area, leakage power, etc.

Some circuit synthesis approaches create an initial circuit design at a given abstraction level (e.g., a logical or physical design). Next, a cell is identified in the circuit design for optimization based on the metrics that are desired to be optimized. An optimal size for the identified cell is then determined by iteratively replacing the identified cell with functionally equivalent cells that have different sizes (this optimization process is also referred to as "sizing the cell"). For each replacement cell size that is tried, the circuit synthesis approach updates timing information, and rejects cell sizes for which one or more timing constraints are violated. The iterative optimization process typically terminates after the optimization process has executed for a certain number of iterations or for a certain amount of time.

Unfortunately, these iterative trial-and-error based circuit synthesis approaches either take too long to complete or produce poor quality results for large circuit designs in which timing constraints are checked across many process corners and modes.

A different circuit synthesis approach is described in Ivan Sutherland, Robert F. Sproull, and David Harris, *Logical Effort: Designing Fast CMOS Circuits*, Morgan Kaufmann, 1999. This approach uses the following linear cell delay model:

$$d = g \cdot h + p, \quad (1)$$

where, g represents the logical effort, h represents the electrical effort, and p represents the parasitic delay of the cell. The logical effort captures the effect of the cell to produce output current. The logical effort is independent of the size of the transistors in the circuit. The electrical effort describes how the electrical environment of the cell affects performance, and how the size of the transistors in the cell determines its load-driving capability. The parasitic delay is a form of delay overhead that accompanies any gate.

Equation (1) can be rewritten as:

$$d = R \cdot C_o + p, \quad (2)$$

where, R is the output resistance of the cell, $C_o$ is the output loading, and p is the parasitic delay of the cell. Equation (2) can then be rewritten as:

$$d = (R \cdot C_i) \cdot \left(\frac{C_o}{C_i}\right) + p, \quad (3)$$

where, $C_i$ is the input capacitance presented by the cell at one of its input terminals. The first term $(R \cdot C_i)$ represents the logical effort g, and the second term $$\left(\frac{C_o}{C_i}\right)$$

represents the electrical effort h. The logical effort g and the parasitic delay p can be normalized, e.g., they can be normalized with respect to the logical effort and parasitic delay values, respectively, of a reference inverter.

The delay model that is used by a circuit synthesis approach must be accurate, i.e., it must accurately model the actual cell delays. If the delay model is inaccurate, the circuit implementation produced by the circuit synthesis approach will likely contain many timing violations. In the above-mentioned work by Sutherland et al., the authors state that the linear delay model is approximate, and it does not accurately model the actual cell delays. As a result, the circuit synthesis approach described in the above-mentioned work produces approximate circuit implementations that are likely to have many timing violations.

SUMMARY

Some embodiments described herein provide methods and systems for determining a numerical delay model based on one or more discretized delay models. A discretized delay model is a delay model in which the delay behavior is represented using a set of discrete data points of delay behavior. A numerical delay model is a delay model that can be used by a numerical solver to optimize a cost function. The numerical delay models generated by embodiments described herein are accurate, and can be used by circuit synthesis approaches to produce optimized circuit implementations that have either no timing violations or very few timing violations.

In some embodiments, a discretized delay model models the delay for a timing arc of a library cell. The term "library cell" refers to a cell that is in a technology library. A technology library is a collection of library cells that can be used to create and/or optimize a circuit design. The term "library cell" is to be distinguished from the term "cell instance" which is an instantiation of a library cell in a circuit design.

In some embodiments, separate discretized delay models exist for one or more of: rise-rise, rise-fall, fall-rise, and fall-fall transitions. The term "rise-rise transition" refers to the situation when the input is a rising transition and the output is also a rising transition. The other terms have similar definitions.

In some embodiments, the numerical delay model can model the delay at different levels of aggregation. For example, the numerical delay model can model (1) the rise delay and fall delay separately for a timing arc of a library cell, (2) the delay (e.g., the worst or average of the rise delay and fall delay) for a timing arc of a library cell, (3) the delay for a timing arc of a library cell type, or (4) the delay for all timing arcs of a library cell type.

In some embodiments, multiple numerical delay models are determined at multiple levels of aggregation. The term "rise delay" and "fall delay" refer to the delay of a timing arc of a library cell that correspond to a rising and falling output transition, respectively. In some embodiments, the term "rise delay" refers to the greater of the rise-rise and fall-rise delays; and the term "fall delay" refers to the greater of the rise-fall and fall-fall delays.

The term "specific numerical delay model" refers to a numerical delay model that models the delay behavior of a particular timing arc of a particular library cell. The term "generic numerical delay model" refers to a numerical delay model that models an aggregated delay behavior of either a timing arc of a library cell type or the library cell type itself.

Some embodiments receive a discretized delay model for the timing arc of the library cell, wherein the discretized delay model is capable of being represented by a set of points in a multi-dimensional space, the multi-dimensional space including an output loading dimension, an input transition dimension, an output delay dimension, and an output transition dimension. Next, the embodiments select elements from the discretized delay model that correspond to a subset of the set of points. The embodiments then determine a specific numerical delay model based on the selected elements.

In some embodiments, at least a first fraction of the subset of the set of points have values in the output loading dimension that are less than a first threshold, and wherein at least a second fraction of the subset of the set of points have values in the input transition dimension that are less than a second threshold.

In some embodiments, determining the specific numerical delay model includes determining a specific logical effort value and a specific parasitic delay value for the timing arc of each library cell. Specifically, in some embodiments, determining the specific logical effort value and the specific parasitic delay value for a particular library cell includes: (1) determining a set of logical effort values and a set of parasitic delay values, wherein determining each logical effort value and parasitic delay value involves determining a linear fit between output loading and output delay for a given input transition value; and (2) determining the specific logical effort value and the specific parasitic delay value for a particular library cell based on the set of logical effort values and the set of parasitic delay values (as determined in (1) above), respectively.

Some embodiments receive a set of discretized delay models, wherein each discretized delay model corresponds to a timing arc of a library cell of a particular library cell type, and wherein each discretized delay model is capable of being represented by a set of points in a multi-dimensional space, the multi-dimensional space including an output loading dimension, an input transition dimension, an output delay dimension, and an output transition dimension. Next, the embodiments determine a set of specific numerical delay models for each library cell of a library cell type based on the set of discretized delay models. The embodiments then determine the generic numerical delay model for a timing arc of the library cell type or for the library cell type itself based on the set of specific numerical delay models computed for each library cell of that library cell type.

In some embodiments, determining the set of specific numerical delay models includes, for each discretized delay model in the set of discretized delay models, (1) selecting elements from the discretized delay model that correspond to a subset of a set of points, wherein the set of points represents the discretized delay model, and (2) determining a specific numerical delay model based on the selected elements.

In some embodiments, determining the generic numerical delay model for a timing arc of the library cell type includes: (1) determining a generic logical effort value for a timing arc of the library cell type based on specific logical effort values for corresponding timing arcs of all library cells of the library cell type; and (2) determining a generic parasitic delay value for a timing arc of the library cell type based on specific parasitic delay values for corresponding timing arcs of all library cells of the library cell type.

In some embodiments, determining the generic numerical delay model for the library cell type includes: (1) determining a logical effort value for the library cell type based on generic logical effort values for all timing arcs of the library cell type; and (2) determining a parasitic delay value for the library cell type based on generic parasitic delay values for all timing arcs of the library cell type.

BRIEF DESCRIPTION OF THE FIGURES

FIG. 1 illustrates a library cell in accordance with some embodiments described herein.

FIG. 2A illustrates how a non-linear delay model (NLDM) can be viewed as a set of points in a four dimensional space (two dimensions correspond to the inputs of the NLDM, and two dimensions correspond to the outputs of the NLDM) in accordance with some embodiments described herein.

FIG. 2B illustrates how an NLDM can be viewed as a two dimensional table in accordance with some embodiments described herein.

DETAILED DESCRIPTION

Figure 3:
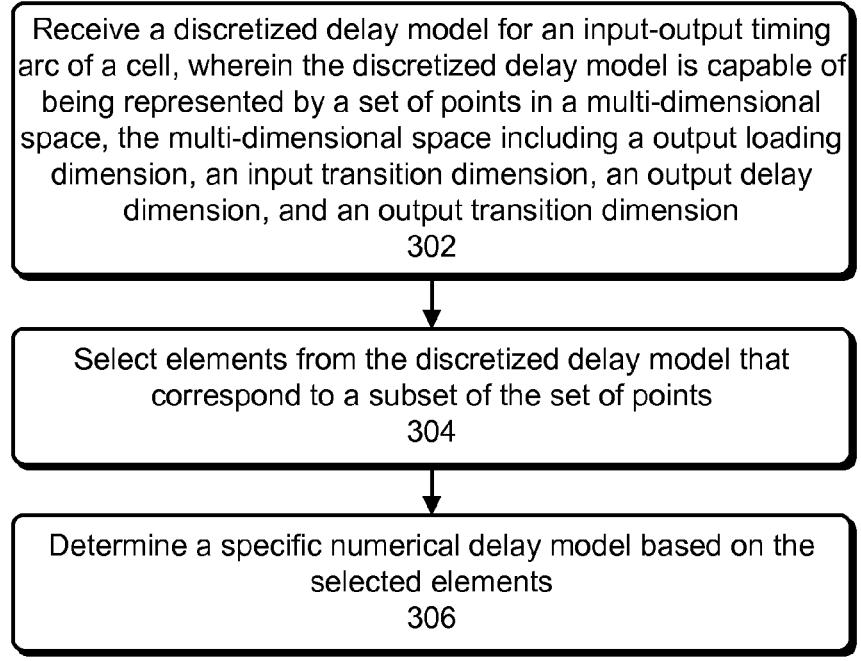
FIG. 3 illustrates a process for determining a specific numerical delay model from a discretized delay model in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are illustrative purposes only and are not intended to limit the embodiments to the forms disclosed.

Some EDA software tools enable circuit designers to describe the functionality that they want to implement. These tools also enable circuit designers to perform what-if planning to refine functionality, check costs, etc. During logic design and functional verification, the HDL (hardware description language), e.g., SystemVerilog, code for modules in the system can be written and the design can be checked for functional accuracy, e.g., the design can be checked to ensure that it produces the correct outputs.

During synthesis and design for test, the HDL code can be translated to a netlist using one or more EDA software tools.

Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout (placement) and can be electrically coupled (routing).

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

FIG. 1 illustrates a library cell in accordance with some embodiments described herein.

The term "library cell type" refers to a particular logical functionality. Examples of functionalities include, but are not limited to, "AND," "OR," "XOR," "multiplexor," etc. The term "library cell" refers to a particular implementation of a library cell type. A technology library is a collection of library cells of one or more library cell types. For example, a technology library may include multiple sizes of an inverter. In this example, the term "inverter" is the library cell type, and the term "library cell" refers to an inverter implementation of a particular size.

Library cell 102 has a set of inputs and a set of outputs. A signal path within library cell 102 from an input to an output is called a timing arc. One or more timing arcs may exist between an input and an output of a library cell. For example, two timing arcs exist between input A and output Z, which are shown as $(A \rightarrow Z)_1$ and $(A \rightarrow Z)_2$ in the figure. Only one timing arc exists between input B and output Z which is shown as $(B \rightarrow Z)$ in the figure. The delay behavior for each timing arc can be different. Furthermore, for a given timing arc, the delay behavior for a rising output transition can be different from the delay behavior for a falling output transition. In complex library cells like multiplexors, the difference in the delay characteristics for different timing arcs and for rising/falling output transitions can be significant.

The term "non-linear delay model," or "NLDM" for short, is used in this disclosure to refer to a discretized delay model that models cell delay. A discretized delay model is a model in which the delay behavior is represented using a set of discrete data points of delay behavior. Specifically, a discretized delay model, e.g., an NLDM, can be viewed as a set of points in a multi-dimensional space that includes an output loading dimension, an input transition (i.e., slew) dimension, an output delay dimension, and an output transition dimension. In some implementations, two or more NLDMs exist for each timing arc of each library cell, wherein each NLDM models the delay for a rise-rise, a rise-fall, a fall-rise, or a fall-fall transition.

FIG. 2A illustrates how an NLDM can be viewed as a set of points in a four dimensional space in accordance with some embodiments described herein. NLDM 202 has n points, each represented as a tuple of four elements. The elements in the tuple represent the values in the four dimensions. For example, $p_{11}$ can be a particular output loading value, $p_{12}$ can be a particular input transition value, $p_{13}$ can be a particular output delay value, and $p_{14}$ can be a particular output transition value. This point can represent one data point in the library cell's delay behavior: if the output load on an output "OUT" of a library cell is equal to $p_{11}$ and the library cell receives an input signal on an input "IN" with an input transition $p_{12}$, then the library cell produces an output signal on output "OUT" after a delay $p_{13}$ with an output transition $p_{14}$.

FIG. 2B illustrates how an NLDM can be viewed as a two dimensional table in accordance with some embodiments described herein.

NLDM 204 can be represented as a two dimensional table, wherein each element in the table is a tuple of two values. Each row in the table corresponds to a particular output loading value: OL1, OL2, . . . , OLn. Each column in the table corresponds to a particular input transition value: IT1, IT2, . . . , ITm. Each element in the table is a tuple of the output delay value and the output transition value. For example, the tuple (OD32, OT32) is a tuple of the output delay value OD32 and the output transition value OT32 that corresponds to the output loading value OL3 and input transition value IT2.

The two dimensional table shown in FIG. 2B can be used to look up the output delay and output transition value for a given output loading and input transition value. Note that each element in the two dimensional table corresponds to a point in a four dimensional space. For example, the element (OD32, OT32) corresponds to the point (OL3, IT2, OD32, OT32).

Since the NLDM is a discretized delay model, it can be made arbitrarily accurate by increasing the number of points in the model that are used to represent the delay behavior. Many existing technology libraries provide accurate NLDMs for all timing arcs of all the library cells.

Some embodiments described herein create a specific numerical delay model from a discretized delay model (e.g., an NLDM in a technology library). A numerical delay model is a delay model that can be used by a numerical solver to optimize a cost function. A linear delay model is one example of a numerical delay model. More generally, an analytical formula that represents the delay behavior is an example of a numerical delay model.

Some embodiments described herein determine a linear delay model from an NLDM. Specifically, some embodiments determine a logical effort value and a parasitic delay value from an NLDM. The electrical effort value in the linear delay model for a timing arc of a library cell is computed using the input capacitance value of the timing arc as specified in the technology library as well as the output loading as seen by the timing arc's instance in the circuit design which instantiates the library cell.

The specific numerical delay model that is computed from the NLDM models the same delay behavior as the NLDM. For example, if the NLDM models the delay for a rising output transition for a particular timing arc of a library cell, then the specific numerical delay model that is determined from the NLDM will also model the delay for a rising output transition for that particular timing arc of the library cell.

Some embodiments described herein determine aggregate numerical delay models based on individual numerical delay models. For example, suppose specific numerical delay model M1 models the rise delay for a particular timing arc of a library cell, and specific numerical delay model M2 models the fall delay for the same timing arc of the library cell. Some embodiments can create an aggregate numerical delay model M3 based on M1 and M2. Aggregate numerical delay model M3 can then be used to model both rise and fall delays. Note that M3 may not model the delays as accurately as M1 and M2. However, in some cases, it may be advantageous to use an aggregate numerical delay model even if it is not as accurate as the individual numerical delay models. Individual numerical delay models can be aggregated in many ways. The examples for aggregating numerical delay models provided in this disclosure are for illustration purposes only, and are not intended to limit the embodiments to the forms disclosed.

FIG. 3 illustrates a process for determining a specific numerical delay model from a discretized delay model in accordance with some embodiments described herein.

The process begins with receiving a discretized delay model for a timing arc of a library cell, wherein the discretized delay model is capable of being represented by a set of points in a multi-dimensional space, the multi-dimensional space including an output loading dimension, an input transition dimension, an output delay dimension, and an output transition dimension (operation 302). The discretized delay model may model the rise or fall delays.

Next, some embodiments select elements in the discretized model that correspond to a subset of the set of points (operation 304). In some embodiments described herein, sample points are selected for output loading and input transition times from the range of output loading and input transition times specified in the NLDM. The number and/or distribution of sample points that are selected can be programmable (e.g., the user may specify the number and/or the distribution in a configuration file).

In some embodiments, the range of output loading is limited using a programmable multiplier, q, as follows. Let $C_i$ be the input capacitance of the timing arc that is being analyzed. If $q \cdot C_i$ is within the output load range specified in the NLDM, then $q \cdot C_i$ is used as the upper bound of the output loading. On the other hand, if $q \cdot C_i$ is greater than the output load range specified in the NLDM, then the range specified in the NLDM is used.

Although the NLDM specifies a wide range of output loading, most library cells (when instantiated in a circuit design) have an operating range of output loading that is typically in the lower half of the output loading range. Therefore, in some embodiments described herein, a programmable parameter, u, between 0% and 100% is used to cluster the output loading sample points, such that a first fraction (e.g., half) of the sample points are clustered around the lower u % of the output loading range. This technique helps bias the numerical models that are derived in the process towards the typical operating range of output loading.

Similarly, although the NLDM specifies a wide range of input transitions, most library cells (when instantiated in a circuit design) have an operating range of input transitions that is typically in the lower half of the input transition range. Therefore, in some embodiments described herein, a programmable parameter, v, between 0% and 100% is used to cluster the input transition sample points, such that a second fraction (e.g., half) of the sample points are clustered around the lower v % of the input transition range.

In other words, in some embodiments described herein, the subset of the set of points is selected so that: (1) at least a first fraction (e.g., half) of the subset of the set of points have values in the output loading dimension that are less than a first threshold (e.g., within the lower u % of the output loading range), and (2) at least a second fraction (e.g., half) of the subset of the set of points have values in the input transition dimension that are less than a second threshold (e.g., within the lower v % of the input transition range).

A specific numerical delay model is then determined based on the selected elements (operation 306).

In some embodiments described herein, the specific numerical delay model is a linear delay model, and a specific logical effort value and a specific parasitic delay value for the timing arc of the library cell is determined based on the subset of the set of points. The terms "specific logical effort value" and "specific parasitic delay value" refer to the logical effort value and the parasitic delay value, respectively, for a particular timing arc of a particular library cell.

The technology library includes the input capacitance for each input of the library cell. The electrical effort value is determined by dividing the output capacitance as seen by the timing arc when instantiated in a circuit design, by the input capacitance for the timing arc of the library cell for which the specific numerical model is being determined. Note that the numerical model essentially determines the logical effort and the parasitic delay parameters. These two parameters as well as the instance-specific output load of the timing arc are used to determine its numerical delay.

In some embodiments, a linear delay model can be computed as follows. Let there be r sample points of output loading and s sample points of input transition time. In other words, let the subset of the set of points be such that there are r distinct output loading values and s distinct input transition time values. For example, the points corresponding to r rows and s columns in the table shown in FIG. 2B can be selected as the subset of the set of points.

Next, for each of the s input transition sample points, the output delay can be plotted as a function of the r output loading sample points. For example, in FIG. 2B, suppose three rows (i.e., r=3) corresponding to output loading values OL2, OL3, and OLn are selected, and two columns (i.e., s=2) corresponding to input transition values IT1 and IT3 are selected. Next, a plot for input transition value IT1 can be created as follows: the output delay values OD21, OD31, and ODn1 can be plotted against output loading values OL2, OL3, and OLn. A plot can similarly be created for input transition value IT3.

For each of the s plots, a linear fit can be determined. In some embodiments, a least-square-fit approach can be used to determine the linear fit. This operation results in s linear relationships for delay as a function of output load, one linear relationship for each of the s input transition sample points. Each linear relationship is of the following form:

$$d_i = m_i \cdot C_o + p_i, i \in s, \quad (4)$$

where $d_i$ is the output delay, $C_o$ is the output loading, $m_i$ is the slope of the linear fit, and $p_i$ is the intercept of the linear fit.

Equation (4) can be rewritten as follows:

$$d_i = (m_i \cdot C_i) \cdot \left(\frac{C_o}{C_i}\right) + p_i, i \in s, \quad (5)$$

where $C_i$ is the input capacitance of the library cell that is being considered (the value of $C_i$ is obtained from the technology library).

Therefore, for $i^{th}$ input transition value, the logical effort for the timing arc of the library cell is equal to $(m_i \cdot C_i)$ and the parasitic delay for the timing arc of the library cell is equal to $p_i$. In this manner, for each of the s input transition values that were selected, a logical effort value and a parasitic delay value can be computed based on the NLDM.

The $(m_i \cdot C_i)$ and $p_i$ values may be different for different i∈s. The following approach can be used to determine a single logical effort value and a single parasitic delay value. First, a subset of the $m_i$ and $p_i$ values that are within a predetermined range can be selected. For example, a programmable value, a, between 0.0 and 1.0, can be received (e.g., from a configuration file). If $m_0$ and $p_0$ are the lowest $m_i$ and $p_i$ values, respectively, then the $m_i$ and $p_i$ values that are in the ranges [$m_0$, $m_0 \cdot (1+a)$] and [$p_0, p_0 \cdot (1+a)$], respectively, can be selected. In some embodiments, different ranges (e.g., different values of a) can be used for selecting the $m_i$ and $p_i$ values.

Once the subsets of $m_i$ and $p_i$ values have been selected, the selected values can be averaged to obtain the specific logical effort value, $g_s$, and the specific parasitic delay value, $p_s$, for the timing arc of the library cell. The terms "specific logical effort value" and "specific parasitic delay values refer to the logical effort value and the parasitic effort value, respectively, for either the rise delay or fall delay for a timing arc of a library cell.

In other words, the specific logical effort value and the specific parasitic delay value can be determined by (1) determining a set of logical effort values and a set of parasitic delay values, wherein determining each logical effort value and parasitic delay value involves determining a linear fit between output loading and output delay for a given input transition value, and (2) determining the specific logical effort value and the specific parasitic delay value based on the set of logical effort values and the set of parasitic delay values, respectively. Some embodiments select a subset of logical effort values and a subset of parasitic delay values (e.g., selecting $m_i$ and $p_i$ values that are within a predetermined range), and then determine the specific logical effort value and the specific parasitic delay value based on the subset of logical effort values and the subset of parasitic delay values, respectively.

The linear rise or fall delay model of a timing arc of a library cell can be expressed as:

$$d_s = g_s \cdot h_s + p_s, \quad (6)$$

where, $d_s$ is the output delay, $g_s$ is the specific logical effort, $$h_s = \left(\frac{C_o}{C_i}\right)$$

is the electrical effort, and $p_s$ is the specific parasitic delay.

Once the specific logical effort values and the specific parasitic delay values are determined, they can then be aggregated in many ways. In some embodiments, the $g_s$ and $p_s$ values for the rise delay and the $g_s$ and $p_s$ values for the fall delay can be averaged to obtain $g_s$ and $p_s$ values that are aggregated across rise and fall delays. These aggregated values can be used to model rise and fall delays. That is, when such aggregation is done, we don't distinguish between rise and fall delays when using the specific numerical delay model.

In some embodiments described herein, the specific logical effort values and the specific parasitic delay values can be aggregated at the library cell type level to obtain a generic logical effort value and a generic parasitic delay value for the library cell type. The terms "generic logical effort value" and "generic parasitic delay value" refer to an aggregated logical effort value and aggregated parasitic delay value, respectively, for an arc of a library cell type. In other words, the terms "generic logical effort value" and "generic parasitic delay value" refer to values that are determined by aggregating corresponding specific values across multiple library cells.

Figure 4:
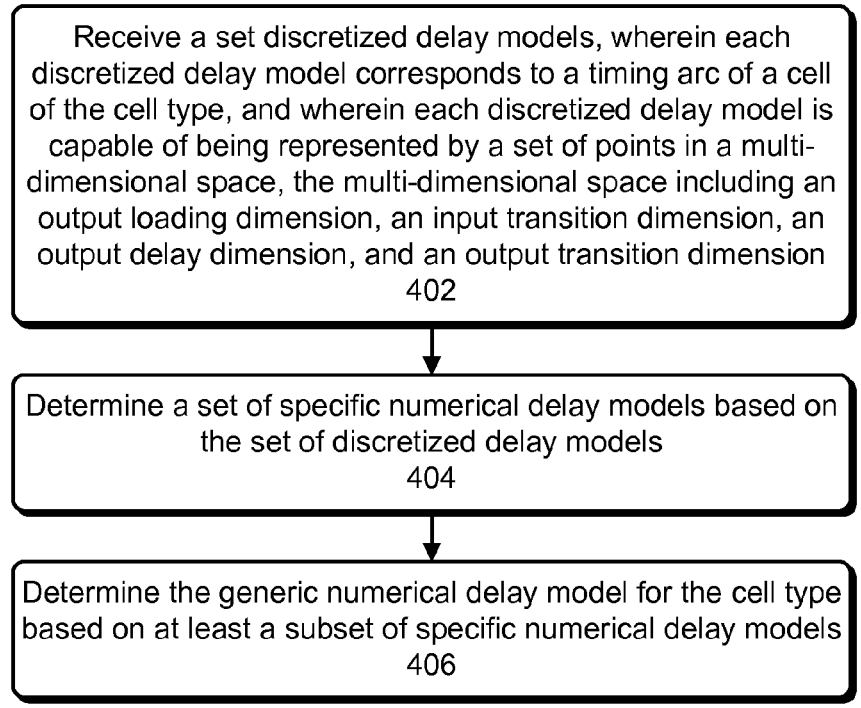
FIG. 4 illustrates a process for determining a generic numerical delay model for a library cell type in accordance with some embodiments described herein.

FIG. 4 illustrates a process for determining a generic numerical delay model for a library cell type in accordance with some embodiments described herein.

The process begins by receiving a set discretized delay models, wherein each discretized delay model corresponds to a timing arc of a library cell of the library cell type, and wherein each discretized delay model is capable of being represented by a set of points in a multi-dimensional space, the multi-dimensional space including an output loading dimension, an input transition dimension, an output delay dimension, and an output transition dimension (operation 402).

Next, a set of specific numerical delay models based on the set of discretized delay models is determined (operation 404). For example, the process shown in FIG. 3 can be used to determine a specific numerical delay model for each discretized delay model in the set of delay models. This process determines the specific logical effort and specific parasitic delay values for each timing arc of each library cell.

Next, the embodiments determine the generic numerical delay model for the library cell type based on at least a subset of specific numerical delay models (operation 406).

In some embodiments described herein, the generic numerical delay model for a timing arc of the library cell type is determined by aggregating the logical effort and parasitic delay values. In some embodiments described herein, each specific numerical delay model for a timing arc of a library cell is defined using a specific logical effort value, a specific parasitic delay value, and an electrical effort value.

To determine a generic numerical delay model for a library cell type, some embodiments use the following approach: (1) determine a set of specific logical effort values and a set of specific parasitic delay values for all timing arcs of all library cells, (2) determine a generic logical effort value and a generic parasitic delay value for each timing arc of the library cell type based on the corresponding specific logical effort values and specific parasitic delay values, respectively (this may involve selecting subsets of logical effort values and parasitic delay values, and then using the subsets to determine the generic logical effort value and the generic parasitic delay value), and (3) determine a logical effort value and parasitic delay value for the library cell type based on the generic logical effort values and generic parasitic delay values for the different timing arcs of the library cell type.

For a particular set of $g_s$ values (e.g., the set of specific logical effort values for a timing arc for a set of library cells of a library cell type), some embodiments can use the following approach to determine a generic logical effort value for that timing arc of a library cell type. First, an embodiment can derive the mean, $\mu$, and a standard deviation, $\sigma$, of the set of $g_s$ values. Next, the embodiment can select a subset of the set of $g_s$ values that contain values that are within a given range of the mean $\mu$. For example, the embodiment can select values that are within one standard deviation of the mean. This would include the $g_s$ values that satisfy the following inequality: $(\mu-\sigma) \leq g_s \leq (\mu+\sigma)$. Let the subset of $g_s$ values be called S. Using the $g_s$ values in S, the embodiment can compute the mean, $\mu_s$. The mean $\mu_s$ can be used as the generic logical effort, g, of the timing arc of the library cell type.

If the rise and fall $g_s$ values were computed separately (e.g., because there were separate discretized models for rise and fall delays), then the embodiment can compute the generic rise logical effort value, $g_r$, and the generic fall logical effort, $g_f$. Next, the embodiment can compute the generic logical effort value for the timing arc of the library cell type by computing an average of the rise and fall logical effort values. In some embodiments, the generic logical effort value for the timing arc of the library cell type can be assigned to be equal to the worst (in this case, the term "worst" corresponds to the maximum value) of $g_r$ and $g_f$ instead of the average of $g_r$ and $g_f$.

A similar approach can be used to determine a generic parasitic delay value for a timing arc of a library cell type based on the specific parasitic delay values. These examples of how a generic logical effort value and a generic parasitic delay value can be computed for a timing arc of a library cell type have been provided for illustration purposes only and are not intended to limit the embodiments to the forms disclosed. Many variations and modifications to the disclosed aggregation techniques will be apparent to those skilled in the art.

Once the generic logical effort value and the generic parasitic delay value has been computed for each timing arc of a library cell type, a logical effort value and a parasitic delay value for the library cell type can be computed. In some embodiments, the generic logical effort value for each timing arc can be averaged (e.g., by assigning the same or different weights to the timing arcs) to obtain a logical effort value for the library cell type. In other embodiments, the logical effort value for the library cell type can be assigned to be the worst (i.e., the maximum in this case) generic logical effort value across all of the timing arcs of the library cell type. A parasitic delay value for the library cell type can be obtained using a similar approach.

Once the one or more specific and/or generic numerical delay models for the library cells and/or library cell types have been computed, they can be used for timing analysis in a circuit synthesis approach to create circuit implementations. Using these numerical delay models in circuit synthesis is expected to result in circuit implementations that do not contain any timing violations or that contain very few timing violations. This is because these numerical delay models are computed from accurate discrete delay models, and because the above-described approaches for creating the numerical delay models select discrete data points in an operating region where the delay behavior is approximately linear.

In some embodiments, a conventional iterative optimization approach (e.g., an optimization that iteratively replaces a cell instance in a circuit design with functionally equivalent library cells) can use a numerical delay model to compute delay. Determining delay using a NLDM requires more computation (because of the NLDM table lookup operation) than determining delay using a numerical delay model. Therefore, using numerical delay models instead of NLDMs can improve performance of conventional iterative optimization approaches. In addition, numerical delay models enables a circuit design to be optimized using numerical solver based optimization approaches which are fundamentally different from, and significantly more powerful than, conventional iterative optimization approaches that use NLDMs.

Figure 5:
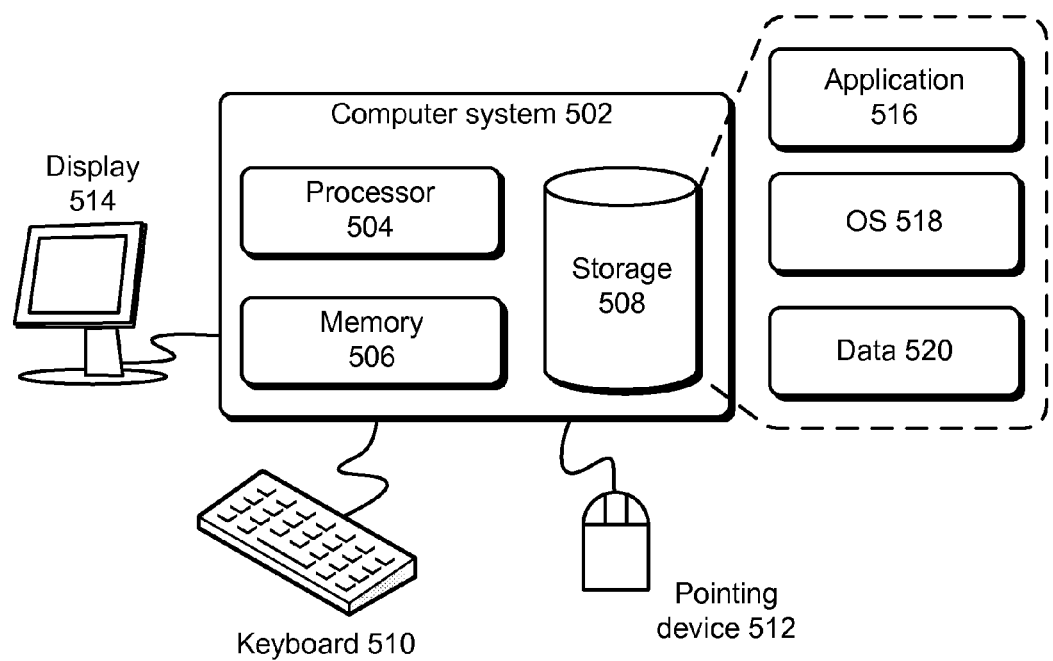
FIG. 5 illustrates a computer system in accordance with an embodiment of the present invention.

FIG. 5 illustrates a computer system in accordance with an embodiment of the present invention.

A computer system can generally be any hardware-based system that can perform computations. Specifically, a computer system can be a microprocessor, an application specific integrated circuit, a distributed computing system, a cloud computing system, or any other computing system now known or later developed. Computer system 502 shows one example of a computer system. Computer system 502 comprises processor 504, memory 506, and storage 508. Computer system 502 can be coupled with display 514, keyboard 510, and pointing device 512. Storage 508 can generally be any device that can store data. Specifically, a storage device can be a magnetic, an optical, or a magneto-optical storage device, or it can be based on flash memory and/or battery-backed up memory. Storage 508 can store application 516, operating system 518, and data 520.

Application 516 can include instructions that when executed by computer 502 cause computer 502 to perform one or more processes that are implicitly or explicitly described in this disclosure. Data 520 can include any data that is inputted into or outputted by application 516.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. A non-transitory computer-readable storage medium includes all computer-readable storage mediums with the sole exception of a propagating electromagnetic wave or signal. Specifically, a non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for determining a generic numerical delay model for a library cell type, the method comprising:
   receiving a set discretized delay models, wherein each discretized delay model corresponds to a timing arc of a library cell of the library cell type, and wherein each discretized delay model is capable of being represented by a set of points in a multi-dimensional space, the multi-dimensional space including an output loading dimension, an input transition dimension, an output delay dimension, and an output transition dimension;
   determining a set of specific numerical delay models based on the set of discretized delay models; and
   determining, by computer, the generic numerical delay model for the library cell type based on at least a subset of specific numerical delay models.

2. The method of claim 1, wherein determining the set of specific numerical delay models includes:
   for each discretized delay model in the set of discretized delay models, selecting elements from the discretized delay model that correspond to a subset of a set of points, wherein the set of points represents the discretized delay model, and determining a specific numerical delay model based on the selected elements.

3. The method of claim 2, wherein the subset of the set of points has values in the output loading dimension that are less than a programmable multiplier times an input capacitance of the timing arc of the library cell, and wherein at least a first fraction of the subset of the set of points has values in the output loading dimension that are less than a first threshold, and wherein at least a second fraction of the subset of the set of points has values in the input transition dimension that are less than a second threshold.

4. The method of claim 1, wherein determining the generic numerical delay model for the library cell type includes:
determining a generic logical effort value for a timing arc of the library cell type based on at least some specific logical effort values for corresponding timing arcs of library cells of the library cell type; and
determining a generic parasitic delay value for a timing arc of the library cell type based on at least some specific parasitic delay values for corresponding timing arcs of library cells of the library cell type.

5. The method of claim 4, wherein determining the generic numerical delay model for the library cell type includes:
determining a logical effort value for the library cell type based on generic logical effort values for timing arcs of the library cell type; and
determining a parasitic delay value for the library cell type based on generic parasitic delay values for timing arcs of the library cell type.

6. A non-transitory computer-readable storage medium storing instructions that, when executed by a computer, cause the computer to perform a method for determining a generic numerical delay model for a library cell type, the method comprising:
receiving a set discretized delay models, wherein each discretized delay model corresponds to a timing arc of a library cell of the library cell type, and wherein each discretized delay model is capable of being represented by a set of points in a multi-dimensional space, the multi-dimensional space including an output loading dimension, an input transition dimension, an output delay dimension, and an output transition dimension;
determining a set of specific numerical delay models based on the set of discretized delay models; and
determining, by computer, the generic numerical delay model for the library cell type based on at least a subset of specific numerical delay models.

7. The non-transitory computer-readable storage medium of claim 6, wherein determining the set of specific numerical delay models includes:
for each discretized delay model in the set of discretized delay models,
selecting elements from the discretized delay model that correspond to a subset of a set of points, wherein the set of points represents the discretized delay model, and
determining a specific numerical delay model based on the selected elements.

8. The non-transitory computer-readable storage medium of claim 7, wherein the subset of the set of points has values in the output loading dimension that are less than a programmable multiplier times an input capacitance of the timing arc of the library cell, and wherein at least a first fraction of the subset of the set of points has values in the output loading dimension that are less than a first threshold, and wherein at least a second fraction of the subset of the set of points has values in the input transition dimension that are less than a second threshold.

9. The non-transitory computer-readable storage medium of claim 6, wherein determining the generic numerical delay model for the library cell type includes:
determining a generic logical effort value for a timing arc of the library cell type based on at least some specific logical effort values for corresponding timing arcs of library cells of the library cell type; and
determining a generic parasitic delay value for a timing arc of the library cell type based on at least some specific parasitic delay values for corresponding timing arcs of library cells of the library cell type.

10. The non-transitory computer-readable storage medium of claim 9, wherein determining the generic numerical delay model for the library cell type includes:
determining a logical effort value for the library cell type based on generic logical effort values for timing arcs of the library cell type; and
determining a parasitic delay value for the library cell type based on generic parasitic delay values for timing arcs of the library cell type.

11. An apparatus, comprising:
a processor; and
a non-transitory computer-readable storage medium storing instructions that, when executed by the processor, cause the apparatus to perform a method for determining a generic numerical delay model for a library cell type, the method comprising:
receiving a set discretized delay models, wherein each discretized delay model corresponds to a timing arc of a library cell of the library cell type, and wherein each discretized delay model is capable of being represented by a set of points in a multi-dimensional space, the multi-dimensional space including an output loading dimension, an input transition dimension, an output delay dimension, and an output transition dimension;
determining a set of specific numerical delay models based on the set of discretized delay models; and
determining, by computer, the generic numerical delay model for the library cell type based on at least a subset of specific numerical delay models.

12. The apparatus of claim 11, wherein determining the set of specific numerical delay models includes:
for each discretized delay model in the set of discretized delay models,
selecting elements from the discretized delay model that correspond to a subset of a set of points, wherein the set of points represents the discretized delay model, and
determining a specific numerical delay model based on the selected elements.

13. The apparatus of claim 12, wherein the subset of the set of points has values in the output loading dimension that are less than a programmable multiplier times an input capacitance of the timing arc of the library cell, and wherein at least a first fraction of the subset of the set of points has values in the output loading dimension that are less than a first threshold, and wherein at least a second fraction of the subset of the set of points has values in the input transition dimension that are less than a second threshold.

14. The apparatus of claim 11, wherein determining the generic numerical delay model for the library cell type includes:
- determining a generic logical effort value for a timing arc of the library cell type based on at least some specific logical effort values for corresponding timing arcs of library cells of the library cell type; and
- determining a generic parasitic delay value for a timing arc of the library cell type based on at least some specific parasitic delay values for corresponding timing arcs of library cells of the library cell type.

15. The apparatus of claim 14, wherein determining the generic numerical delay model for the library cell type includes:
- determining a logical effort value for the library cell type based on generic logical effort values for timing arcs of the library cell type; and
- determining a parasitic delay value for the library cell type based on generic parasitic delay values for timing arcs of the library cell type.

* * * * *